(12) United States Patent
Sommer et al.

(10) Patent No.: US 10,037,948 B2
(45) Date of Patent: Jul. 31, 2018

(54) INVISIBLE COMPARTMENT SHIELDING

(71) Applicant: Apple Inc., Cupertino, CA (US)

(72) Inventors: Phillip R. Sommer, Newark, CA (US); Kishore N. Renjan, Singapore (SG); Manoj Vadeentavida, Singapore (SG)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/241,665

(22) Filed: Aug. 19, 2016

(65) Prior Publication Data

US 2018/0053731 A1 Feb. 22, 2018

(51) Int. Cl.
*H01L 21/56* (2006.01)
*H01L 23/552* (2006.01)
*H01L 23/29* (2006.01)

(52) U.S. Cl.
CPC ......... *H01L 23/552* (2013.01); *H01L 21/565* (2013.01); *H01L 23/293* (2013.01)

(58) Field of Classification Search
CPC ......... H01L 21/28088; H01L 21/30608; H01L 21/6835; H01L 21/6836; H01L 21/76895; H01L 21/78; H01L 21/02181; H01L 21/0228; H01L 21/02321; H01L 21/31105; H01L 21/31144; H01L 21/4846; H01L 21/76843

USPC .......................................................... 257/659
See application file for complete search history.

(56) References Cited

U.S. PATENT DOCUMENTS

| | | | |
|---|---|---|---|
| 8,421,200 B2 | 4/2013 | Tajika et al. | |
| 9,144,183 B2 | 9/2015 | Chen et al. | |
| 9,271,436 B2 | 2/2016 | Chen et al. | |
| 2009/0072357 A1 | 3/2009 | Tang et al. | |
| 2012/0106085 A1* | 5/2012 | Yamazaki | G01J 5/029 361/705 |
| 2014/0126159 A1 | 5/2014 | Lin et al. | |
| 2015/0271959 A1 | 9/2015 | Chen et al. | |

* cited by examiner

*Primary Examiner* — Julio J Maldonado
*Assistant Examiner* — Rodolfo D Fortich
(74) *Attorney, Agent, or Firm* — Fletcher Yoder PC

(57) ABSTRACT

A method for shielding a compartment in a module of an electronic device includes molding the module using a mold material that activates when a laser is applied. The method also includes cutting a trench on the mold of the module around a certain portion of the module using the laser. The method further includes plating the trench using a certain metal. The method also includes filling the trench with a filler material. The method further includes encapsulating the module, the mold, the trench, and the filler material.

19 Claims, 6 Drawing Sheets

INVISIBLE COMPARTMENT SHIELDING

BACKGROUND

The present disclosure relates generally to shielding a compartment in a module of an electronic device and, more particularly, to shielding a compartment that may generate electromagnetic interference (EMI) by plating a trench surrounding the compartment.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Some electronic devices include multiple integrated circuits enclosed in a single module or package. This is often the case with system-in-package (SiP) modules. An SiP module may enable a smaller, more portable, and quicker-to-manufacture electronic device that performs more functions. However, the electrical functions performed by the SiP module may generate EMI, which could affect the operation of other components of the electronic device and even other electronic devices. Before metallizing the SiP module surface via a sputtering process, a compartment-shielding trench may be cut around a portion of the SiP module that generates relatively high EMI. The compartment-shielding trench may be filled with a material (such as conductive epoxy) that reduces the EMI attempting to pass through the trench. In this manner, the compartment-shielding trench may shield the remainder of the SiP module from the EMI generated from the relatively high EMI-generating portion. However, after application, the material may include voids that leave noticeable marks after sputtering. The noticeable marks may be aesthetically undesirable and may reveal the design of the SiP module.

SUMMARY

The disclosed embodiments relate to systems, devices, and methods for shielding a compartment of a module in an electronic device, such as a system-in-package (SiP) or system-in-a-package module, in an aesthetically pleasing way. The compartment shielding may hide distinctions between separate compartments of the module, such as separate integrated circuits. Indeed, in some cases, the compartment shielding may even be considered substantially invisible. Thus, in some cases, the module may appear to be contiguous and without separate compartments.

The compartment shielding of this disclosure may shield one compartment from electromagnetic interference (EMI) generated by another compartment in the same module of an electronic device. A mold may encapsulate the two compartments in the module. A trench may be cut into the mold between the two compartments or around one of the compartments. The trench may be plated and a shielding material, such as conductive epoxy or conductive polymer paste, may be installed onto the plating. The plating may increase the conductivity of the shielding and more effectively block EMI by reducing or eliminating voids in the shielding material. The plating process may also use a narrower trench (e.g., when compared to using conductive epoxy or conductive polymer paste alone), rendering the trench harder to detect and reducing the footprint of the trench on the module. The module and trench may be encapsulated (e.g., with metal) using a technique that leaves virtually no indication of the trench (e.g., when compared to sputtering over voids in the shielding material), decreasing visibility of the trench and more effectively hiding the design of the module.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
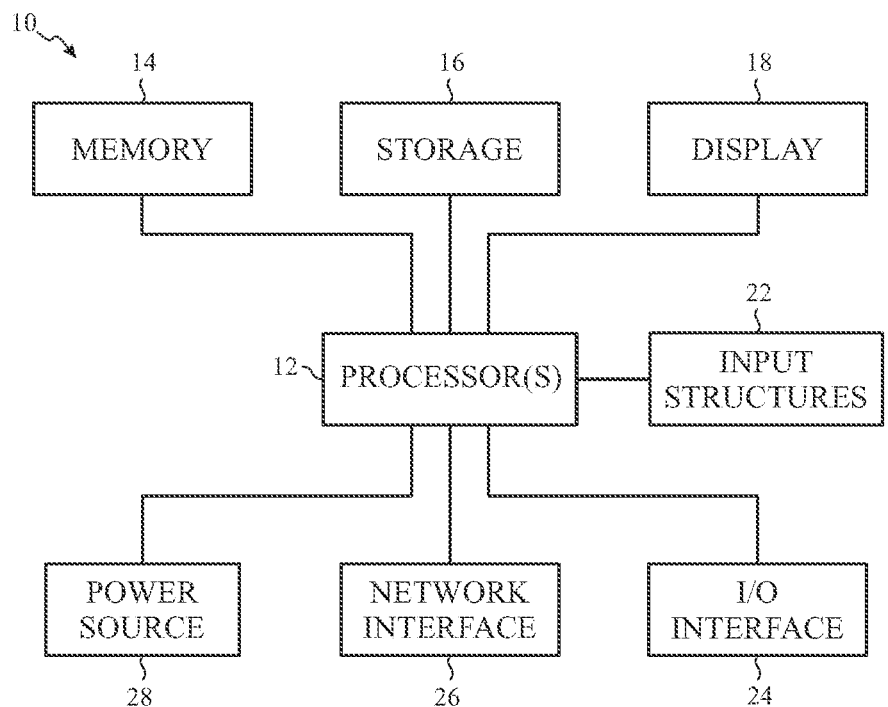
FIG. 1 is a block diagram of an electronic device, in accordance with an embodiment of the present disclosure.

A general description of suitable electronic devices that may include and use a module that includes a shielded compartment in accordance with the present disclosure, such as a system-in-package (SiP) or system-in-a-package module, is provided. Although this disclosure will refer to the SiP module in the description below, it should be appreciated that the systems, methods, and devices of the disclosure may employ any suitable modules having at least two compartments, at least one of which is shielded according to these techniques. With this in mind, FIG. 1 is a block diagram of an electronic device 10, in accordance with an embodiment of the present disclosure. The electronic device 10 may include, among other things, one or more processor(s) 12, memory 14, storage or nonvolatile memory 16, a display 18, input structures 22, an input/output (I/O) interface 24, network interfaces 26, and a power source 28. The various functional blocks shown in FIG. 1 may include hardware elements (including circuitry), software elements (including computer code stored on a computer-readable medium), or a combination of both hardware and software elements. It should be noted that FIG. 1 is merely one example of a particular implementation and is intended to illustrate the types of components that may be present in electronic device 10.

Figure 2:
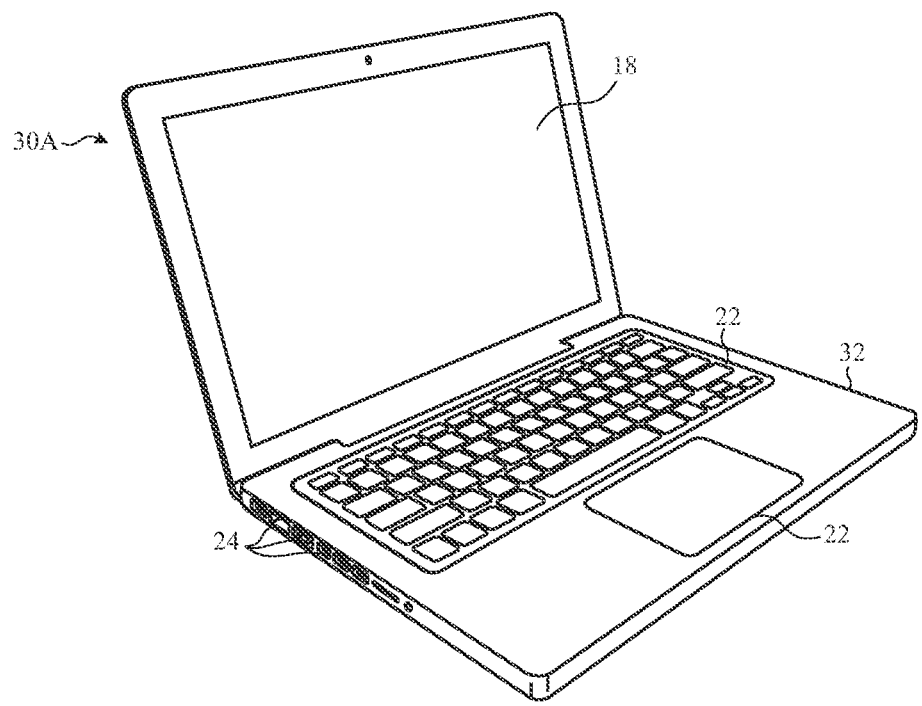
FIG. 2 is a perspective view of a notebook computer representing an embodiment of the electronic device of FIG. 1.
Figure 3:
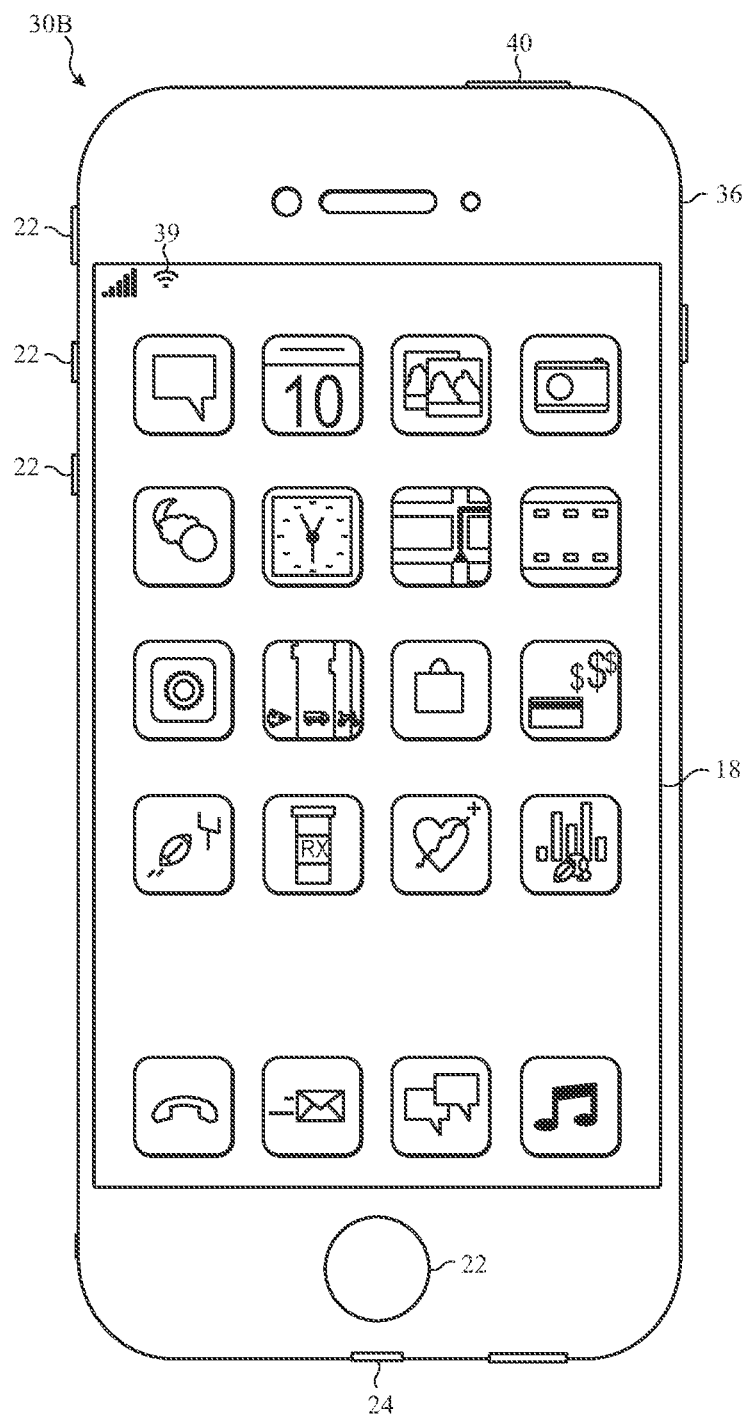
FIG. 3 is a front view of a handheld device representing another embodiment of the electronic device of FIG. 1.
Figure 4:
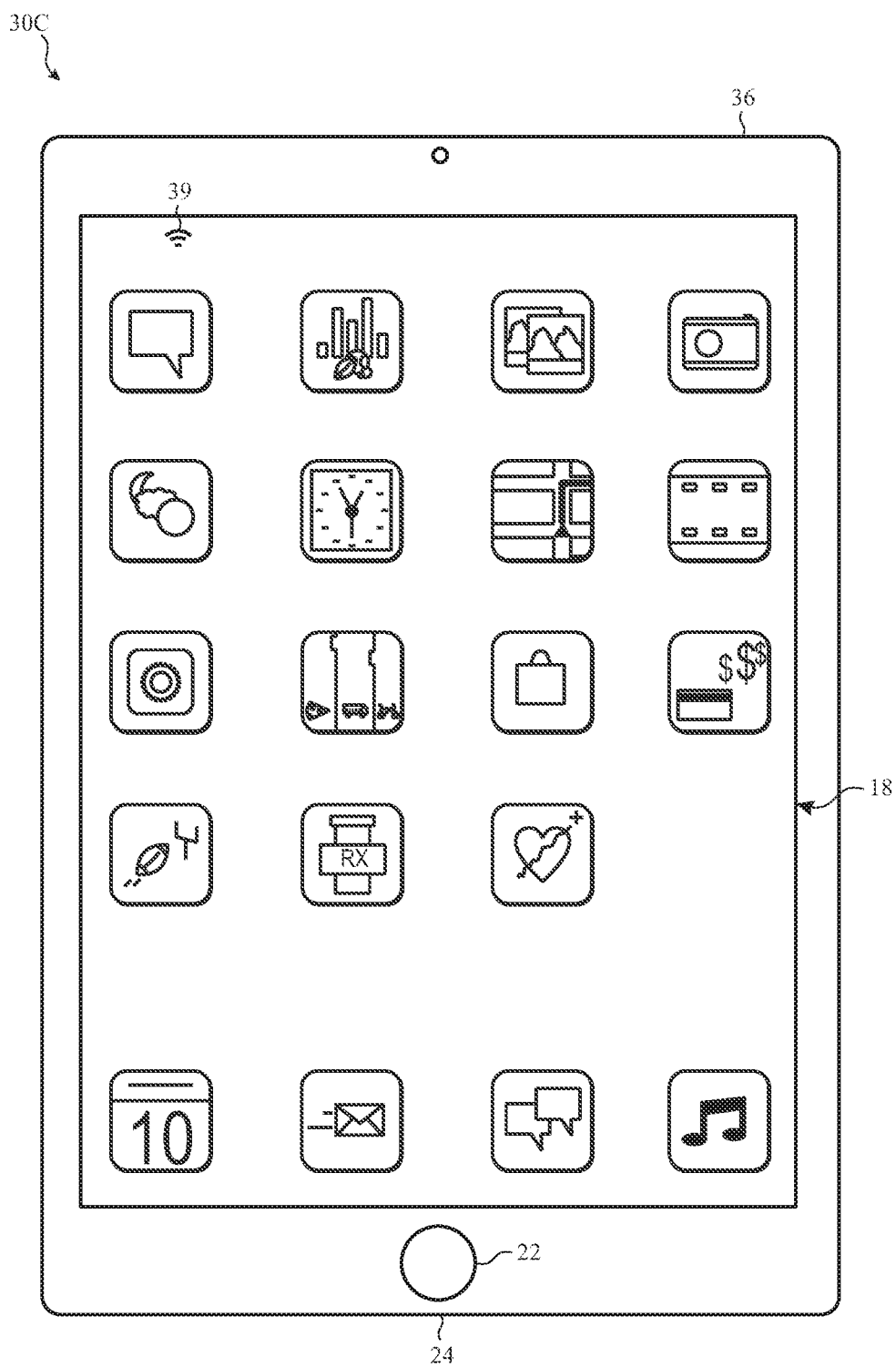
FIG. 4 is a front view of another handheld device representing another embodiment of the electronic device of FIG. 1.
Figure 5:
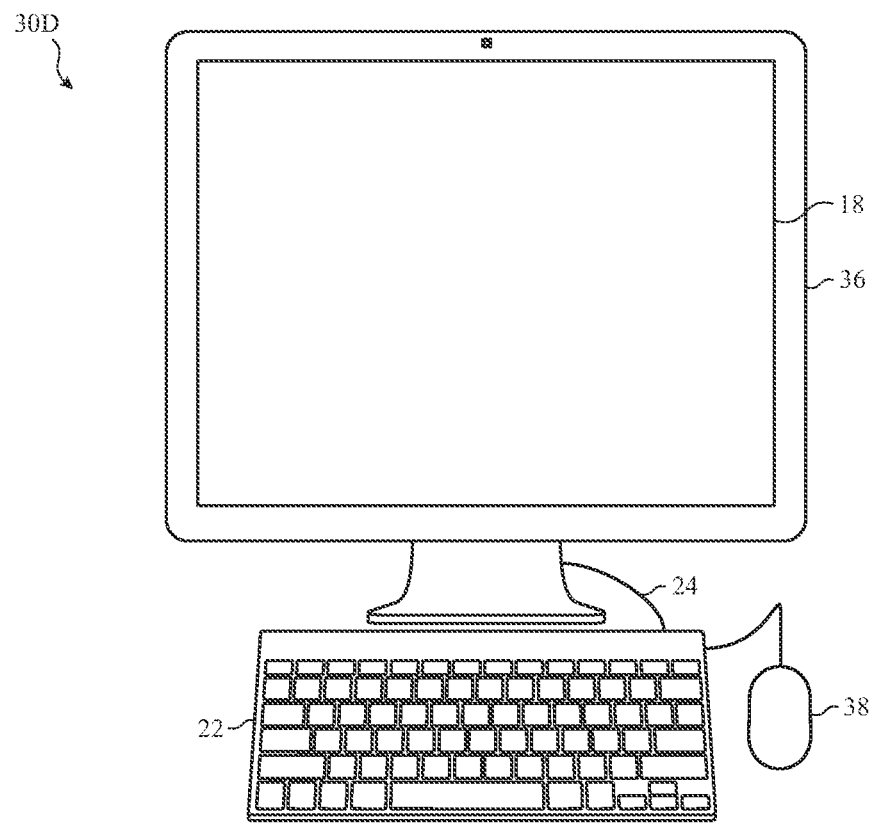
FIG. 5 is a front view of a desktop computer representing another embodiment of the electronic device of FIG. 1.
Figure 6:
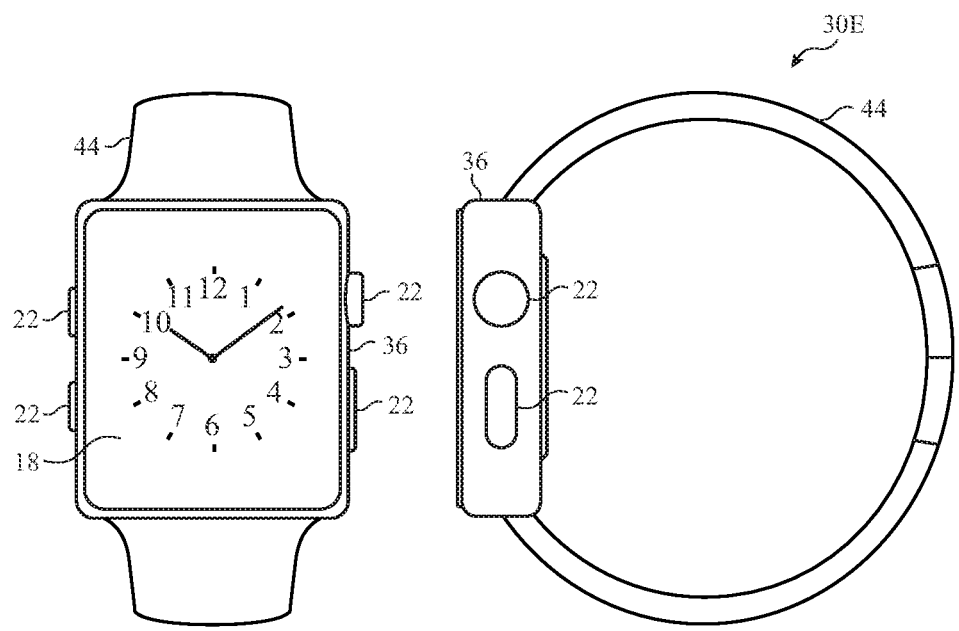
FIG. 6 is a front view of a wearable electronic device representing another embodiment of the electronic device of FIG. 1.

By way of example, the electronic device 10 may represent a block diagram of the notebook computer 30A depicted in FIG. 2, the handheld devices 30B, 30C depicted in FIG. 3 and FIG. 4, the desktop computer 30D depicted in FIG. 5, the wearable electronic device 30E depicted in FIG. 6, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 and/or other data processing circuitry may be operably coupled with the memory 14 and the nonvolatile storage 16 to perform various methods. Such programs or instructions executed by the processor(s) 12 may be stored in any suitable article of manufacture or computer program product that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on the memory 14 or the nonvolatile storage 16 may also include instructions that may be executed by the processor(s) 12 to enable the electronic device 10 to provide various functionalities.

The display 18 may be any suitable electronic display to enable users to view images generated on the electronic device 10, such as a liquid crystal display (LCD) or a self-emissive display such as an organic light emitting diode (OLED) display. In some embodiments, the display 18 may include a touch screen, which may allow users to interact with a user interface of the electronic device 10. The input structures 22 of the electronic device 10 may enable a user to interact with the electronic device 10 (e.g., pressing a button to increase or decrease a volume level). The I/O interface 24 may enable electronic device 10 to interface with various other electronic devices. The I/O interface 24 may include various communications interfaces, such as a universal serial bus (USB) port, a serial communication port (e.g., RS232), Apple's Lightning® connector, or other communications interfaces.

The network interfaces 26 may also enable electronic device 10 to interface with various other electronic devices and may include, for example, interfaces for a personal area network (e.g., PAN), such as a Bluetooth network, for a local area network (e.g., LAN) or wireless local area network (e.g., WLAN), such as an 802.11x Wi-Fi network, and/or for a wide area network (e.g., WAN), such as a $3^{rd}$ generation (e.g., 3G) cellular network, $4^{th}$ generation (e.g., 4G) cellular network, or long term evolution (e.g., LTE) cellular network. The network interfaces 26 may include interfaces for, for example, broadband fixed wireless access networks (e.g., WiMAX), mobile broadband Wireless networks (e.g., mobile WiMAX), asynchronous digital subscriber lines (e.g., ADSL, VDSL), digital video broadcasting-terrestrial (DVB-T) and its extension DVB Handheld (DVB-H), ultra Wideband (UWB), alternating current (AC) power lines, and so forth. The power source 28 may include any suitable source of energy to power the electronic device 10, such as a rechargeable lithium polymer (e.g., Li-poly) battery and/or an alternating current (e.g., AC) power converter.

The electronic device 10 may take the form of a computer, a portable electronic device, a wearable electronic device, or other type of electronic device. For example, the electronic device 10 may be a model of a MacBook®, MacBook® Pro, MacBook Air®, iMac®, Mac® mini, or Mac Pro® available from Apple Inc. In FIG. 2, the electronic device 10 takes the form of the notebook computer 30A. The depicted computer 30A may include a housing or enclosure 32, a display 18, input structures 22, and ports of the I/O interface 24. In one embodiment, the input structures 22 (e.g., such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents an embodiment of the electronic device 10. The handheld device 30B may represent, for example, a portable phone, a media player, a personal data organizer, a handheld game platform, or any combination of such devices. By way of example, the handheld device 30B may be a model of an iPod® or iPhone® available from Apple Inc. of Cupertino, Calif. FIG. 4 depicts a front view of another handheld device 30C, which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

The handheld device 30B or 30C may include enclosures 36 to protect interior components from physical damage and to shield them from electromagnetic interference. The enclosures 36 may surround the displays 18, which may display indicator icons 39. The indicator icons 39 may indicate, among other things, a cellular signal strength, Bluetooth connection, and/or battery life. The I/O interfaces 24 may open through the enclosures 36 and may include, for example, an I/O port for a hard wired connection for charging and/or content manipulation using a connector and protocol, such as the Lightning connector provided by Apple Inc., a universal service bus (e.g., USB), one or more conducted radio frequency connectors, or other connectors and protocols.

User input structures 22, 40, in combination with the display 18, may allow a user to control the handheld device 30B or 30C. For example, the input structure 40 may activate or deactivate the handheld device 30B or 30C, one of the input structures 22 may navigate a user interface of the handheld device 30B or 30C to a home screen, a user-configurable application screen, and/or activate a voice-recognition feature of the handheld device 30B or 30C, while other of the input structures 22 may provide volume control, or may toggle between vibrate and ring modes. Additional input structures 22 may also include a microphone that may capture a user's voice for various voice-related features, and a speaker to allow for audio playback and/or certain phone capabilities. The input structures 22 may also include a headphone input to provide a connection to external speakers and/or headphones.

Turning to FIG. 5, a computer 30D may represent another embodiment of the electronic device 10 of FIG. 1. The computer 30D may be any suitable form of computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (e.g., PC) by another manufacturer. A similar enclosure 36 may be provided to protect and enclose internal components of the computer 30D such as a dual-layer display. In certain embodiments, a user of the computer 30D may interact with the computer 30D using various peripheral input devices, such as input structures 22 (e.g., a keyboard or a mouse 38), which may connect to the computer 30D via a wired and/or wireless I/O interface 24.

Similarly, FIG. 6 depicts a wearable electronic device 30E representing another embodiment of the electronic device 10 of FIG. 1. By way of example, the wearable electronic device 30E, which may include a wristband 44, may be an Apple Watch® by Apple, Inc. However, in other embodiments, the wearable electronic device 30E may include any wearable electronic device such as, for example, a wearable exercise monitoring device (e.g., e.g., pedometer, accelerometer, heart rate monitor), or other device by another manufacturer. The display 18 of the wearable electronic device 30E may include a touch screen (e.g., e.g., LCD, OLED display, active-matrix organic light emitting diode (e.g., AMOLED) display, and so forth), which may allow users to interact with a user interface of the wearable electronic device 30E.

Figure 7:
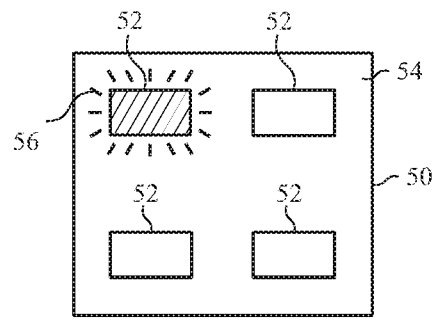
FIG. 7 is a schematic diagram of a system in package (SiP) module of the electronic device of FIG. 1, in accordance with an embodiment of the present disclosure.

FIG. 7 is a schematic diagram of a system in package (SiP) or system-in-a-package module 50 of the electronic device 10 of FIG. 1, in accordance with an embodiment of the present disclosure. The SiP module 50 may include one or more components 52, such as one or more integrated circuits, coupled to a printed circuit board 54. The printed circuit board 54 may include a ground layer or plane to which traces are provided to access a ground signal. The components 52 may include the processor(s) 12, the memory 14, the storage 16, the network interface 26, a portion of circuitry of the SiP module 50, and the like. One or more of the components 52 may generate electromagnetic noise interference (EMI) 56 when performing its respective function(s). The EMI 56 may affect the operation of the other components 52 of the electronic device 10, and even other electronic devices.

Figure 8:
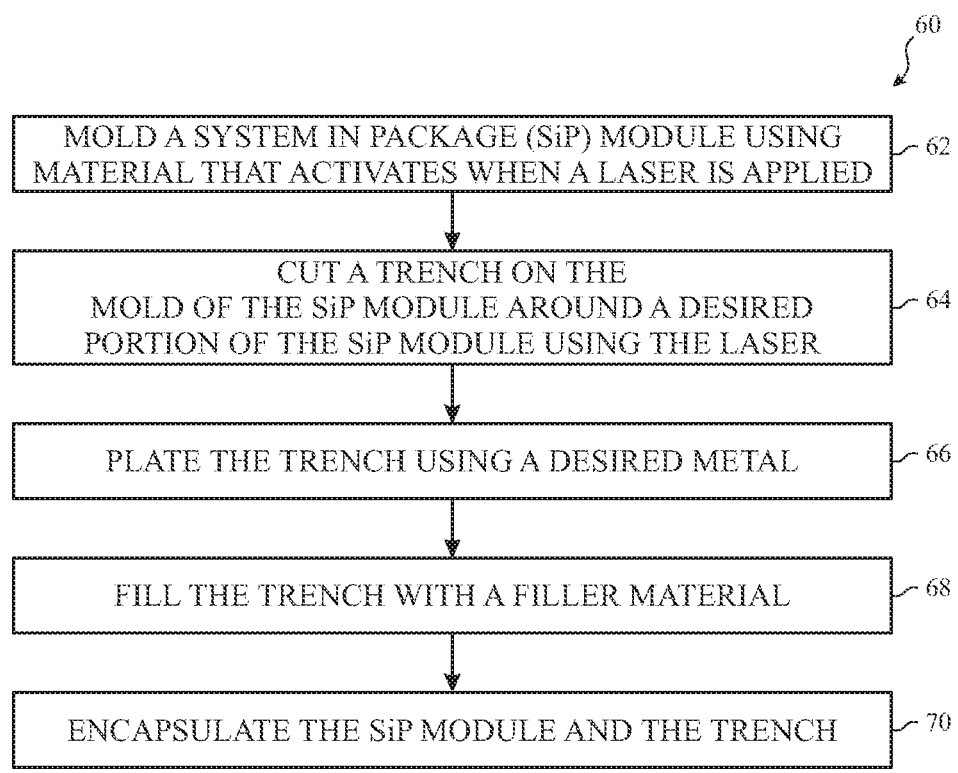
FIG. 8 is a flowchart illustrating a method for shielding a component of the SiP module, in accordance with an embodiment of the present disclosure.

FIGS. 8-11 will be discussed concurrently. FIG. 8 is a flowchart illustrating a method 60 for shielding a component 52 of the SiP module 50, such that EMI 56 generated by the component 52 is reduced, in accordance with an embodiment of the present disclosure. The SiP module 50 is molded (block 62) using a molding material that activates when a laser is applied. That is, the SiP module 50 is encapsulated with the mold material that activates such that, when the molding material is plated, the plating may only adhere to where the molding material has been activated by the laser. In some embodiments, the molding material may be a thermoplastic material, such as molded interconnect device (MID) molding material, that activates when the laser is applied. In particular, the molding material may be doped with a metal-plastic additive that is activated by the laser, such as Laser Direct Structuring (LDS)-grade resin. For example, the mold material may include a Palladium seed layer, such that when the mold material is electrolessly plated, conductor path layers arise where the laser was applied.

Figure 9:
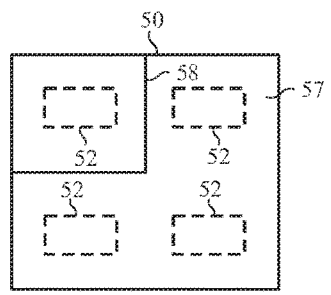
FIG. 9 is a block diagram of the SiP module of FIG. 7 that has been molded with a mold material and includes a trench cut on the mold, in accordance with an embodiment of the present disclosure.

A trench is then cut (block 64) on the mold of the SiP module 50 (from block 62) around a desired portion of the SiP module 50 using the laser, as shown in FIG. 9. FIG. 9 is a block diagram of the SiP module 50 of FIG. 7 that has been molded with a mold material and includes a trench 58 cut on the mold 57, in accordance with an embodiment of the present disclosure. The desired portion of the SiP module 50 may be the component 52 that generates undesirable EMI 56. In some embodiments, the desired portion of the SiP module 50 may include multiple portions (e.g., multiple components 52), such that multiple trenches 58 may be cut on the mold 57 of the SiP module 50.

The laser may be any suitable laser for cutting the trench 58 at desired dimensions. For example, the laser may cut the trench 58 having a width of between approximately 100 and 600 micrometers or microns (e.g., approximately 200 microns, 250 microns, 300 microns, 350 microns, 400 microns, 450 microns, 500 microns, or the like). The laser may cut the trench 58 such that a depth of the trench 58 is less than that of a thickness of the mold 57 of the SiP module 50 to avoid damaging the components 52 of the SiP module 50. For example, the laser may cut the trench 58 at a depth of less than approximately 800 microns when the thickness of the mold 57 is approximately 800 microns. The laser may cut the trench 58 at a depth of between approximately 500 and 1200 microns (e.g., approximately 600 microns, 650 microns, 700 microns, 750 microns, 800 microns, 850 microns, 900 microns, or the like). In some embodiments, the laser may be configured for LDS. For example, the mold material of the SiP module 50 may include a Palladium seed layer that is approximately 800 microns deep. The laser may cut a trench 58 approximately 750 microns deep in the mold 57 of the SiP module 50. When the laser cuts the trench 58, the Palladium in the mold material may form a micro-rough track, wherein the Palladium of the track form nuclei for subsequent metallization when plated.

The trench 58 is then plated (block 66) using a desired metal. The plating may be performed by electroplating, electroless plating, Physical Vapor Deposition (PVD) (e.g., sputter deposition), or any other suitable plating process. Electroplating includes applying an electrical current to reduce dissolved metal cations to form a metal coating on the trench 58. Electroless plating includes producing a chemical reaction in an aqueous solution in which hydrogen is released by a reducing agent and oxidized, producing a negative charge on the trench 58, and ultimately reacting with metal ions to deposit metal on the trench 58. Electroless plating is performed without the use of external electrical power. PVD includes a vacuum deposition method that can be used to produce a thin film on the trench 58. Sputter deposition is a PVD method that includes ejecting material (e.g., metal) onto the trench 58.

The desired metal to be plated may be based at least in part on a range of frequencies of the EMI 56 generated by the component 52 that is to be shielded. For example, the desired metal may include copper, nickel, or the like. The plating may only adhere to where the laser was applied to the mold 57 of the SiP module 50 because of characteristics of the mold material. The depth of the plating may be any suitable depth that reduces the EMI 56 generated by the component 52. For example, the depth of the plating may be between approximately 1 and 20 microns (e.g., 2 microns, 4 microns, 6 microns, 10 microns, 12 microns, or the like). For example, the mold 57 of the SiP module 50 may include a Palladium seed layer and a laser-cut trench 58 that is approximately 750 microns deep. The trench 58 may be electrolessly copper plated at a plating depth of 6 microns. The copper plating may only adhere to where the laser was applied to the mold 57 because of the Palladium forming nuclei for subsequent metallization.

The trench 58 is filled (block 68) with a filler material. The filler material may be any suitable filler material that does not impair the shielding effect of the plated trench 58 and fill the trench 58 to a level approximately even with uncut portions of the mold 57. For example, the filler material may include, conductive epoxy, conductive polymer paste, hard encapsulant, etc. The filler material may be chosen such that, when encapsulated, there are virtually no noticeable marks on the resulting metal layer. In some embodiments, the filler material may be back filled such that the trench 58 may be virtually invisible after encapsulation. For example, the copper plated trench 58 of the SiP module 50 may be back-filled with conductive epoxy.

Figure 10:
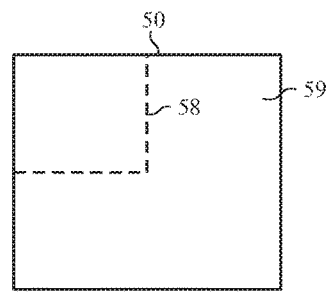
FIG. 10 is block diagrams of the SiP module of FIG. 9 that has been encapsulated with a protective layer, in accordance with an embodiment of the present disclosure.
Figure 11:
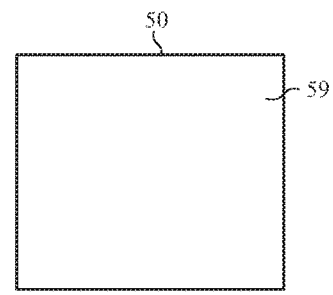
FIG. 11 is block diagrams of the SiP module of FIG. 9 that has been encapsulated with the protective layer, in accordance with an embodiment of the present disclosure.

The SiP module 50 and the trench 58 are then encapsulated (block 70) using any suitable encapsulation process. FIGS. 10 and 11 are block diagrams of the SiP module 50 of FIG. 9 that has been encapsulated with a protective layer 59, in accordance with an embodiment of the present disclosure. FIG. 10 illustrates a position of the trench 58 in the SiP module 50, while FIG. 11 illustrates that the trench 58 is substantially invisible after being encapsulated. The encapsulation process may create a protective layer that encapsulates the SIP module, the mold, and the trench. In some embodiments, the protective layer may be composed of any suitable metal, such as nickel. In some embodiments, the encapsulation process may include electroplating, electroless plating, Physical Vapor Deposition (e.g., sputter deposition), or any other suitable plating process. The depth of the encapsulation may be any desired depth to adequately cover and protect the SiP module 50. In some embodiments, the depth of the encapsulation may be between approximately 1 and 20 microns (e.g., 1 micron, 2 microns, 5 microns, 10 microns, or the like). For example, the SiP module 50 and the copper plated trench may be encapsulated using an electroless nickel plating process, such that the nickel plating is approximately 1 micron deep. The metal layer, the mold, and any features in between the metal layer and the mold (e.g., the trench, the plating on the trench, the filler material, etc.) may be referred to as an encapsulation of the SiP module 50. In some embodiments, the encapsulant may not be metal, but any suitable encapsulant that may effectively protect and/or obscure the design of the SiP module 50.

The plating of the trench may provide increased conductivity and more effectively block EMI by reducing or eliminating voids in the shielding material that may be a result when using conductive epoxy or conductive polymer paste as the shielding material. The plating process may also use a narrower trench (e.g., when compared to using conductive epoxy or conductive polymer paste), rendering the trench harder to detect and reducing the footprint of the trench on the SiP module 50. The SiP module 50 and trench may be encapsulated (e.g., with metal) using a technique that leaves virtually no indication of the trench (e.g., when compared to sputtering over voids in the shielding material), decreasing visibility of the trench and more effectively hiding the design of the SiP module 50.

Figure 12:
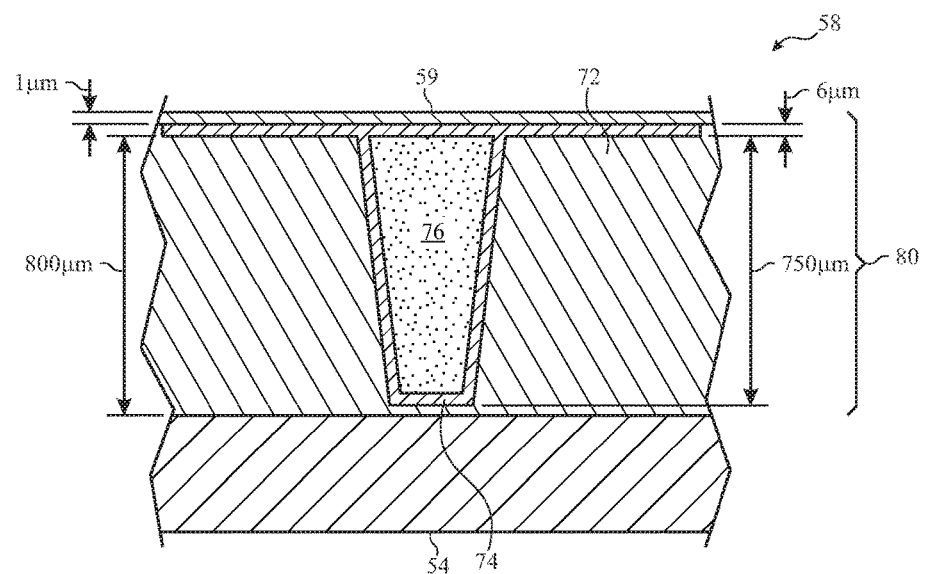
FIG. 12 is a cross-sectional view of the trench of the SiP module of FIGS. 9-11 upon which the method of FIG. 8 has been applied, in accordance with an embodiment of the present disclosure.

FIG. 12 is a cross-sectional view of the trench 58 of the SiP module 50 of FIGS. 9-11 upon which the method 60 of FIG. 8 has been applied, in accordance with an embodiment of the present disclosure. As illustrated, the SiP module 50 includes the printed circuit board 54 which may be coupled to components 52 of the SiP module 50. A mold 72 has been applied to the SiP module 50 using the mold material that activates when a laser is applied. For example, the mold 72 may include a Palladium seed layer and have a depth of approximately 600-1000 microns deep. As illustrated in FIG. 12, the depth of the mold 72 is approximately 800 microns deep. The trench 58 has been cut in the mold 72 using a laser. For example, the trench 58 may be approximately 550-950 microns deep. As illustrated in FIG. 12, the depth of the mold 72 is approximately 750 microns deep. A metal plating 74 has been applied to the trench 58 via a plating process. For example, the metal plating 74 may be applied electrolessly and have a depth of approximately 0.1-20 microns. As illustrated, the depth of the metal plating 74 is approximately 6 microns deep. The trench 58 has been filled with a filler material 76. The SiP module 50, the mold 72, the trench 58 and the filler material 76 have been encapsulated (e.g., covered by a protective layer 59). For example, the SiP module 50, the mold 72, the trench 58, and the filler material 76 may have been encapsulated using an electroless nickel plating process providing a nickel plating protective layer 59 that is approximately 0.1-20 microns deep. As illustrated in FIG. 12, the depth of the nickel plating protective layer 59 is approximately 1 micron deep. As illustrated, the metal layer 59, the mold 72, and any features in between the nickel plating protective layer 59 and the mold 72 (e.g., the trench 58, the plating 74 on the trench 58, the filler material 76, etc.) may be referred to as an encapsulation 80 of the SiP module 50.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A method for shielding a compartment in a module of an electronic device, comprising:
   molding the module using a mold material that activates when a laser is applied, wherein activation causes metal plating to adhere to the mold material when the laser is applied;
   cutting a trench on the mold material of the module around a certain portion of the module using the laser;
   plating the trench using the metal plating configured to reduce electromagnetic interference to or from the module;
   filling the trench with a filler material; and
   encapsulating the module, the mold material, the trench, and the filler material.

2. The method for shielding the compartment in the module of the electronic device of claim 1, wherein plating the trench using the metal plating comprises electroplating.

3. The method for shielding the compartment in the module of the electronic device of claim 1, wherein plating the trench using the metal plating comprises electroless plating.

4. The method for shielding the compartment in the module of the electronic device of claim 1, wherein plating the trench using the metal plating comprises Physical Vapor Deposition (PVD).

5. The method for shielding the compartment in the module of the electronic device of claim 1, wherein plating the trench using the metal plating comprises sputter deposition.

6. The method for shielding the compartment in the module of the electronic device of claim 1, wherein encapsulating the module, the mold material, the trench, and the filler material comprises electroplating.

7. The method for shielding the compartment in the module of the electronic device of claim 1, wherein encapsulating the module, the mold material, the trench, and the filler material comprises electroless plating.

8. The method for shielding the compartment in the module of the electronic device of claim 1, wherein encapsulating the module, the mold material, the trench, and the filler material comprises Physical Vapor Deposition (PVD).

9. An encapsulation for a module of an electronic device, comprising:
   a mold comprising:
      a mold material that activates when a laser is applied, wherein activation causes metal plating to adhere to the mold material when the laser is applied;
      a plated trench around a certain portion of the module, comprising the metal plating configured to reduce electromagnetic interference to or from the module; and
      filler material disposed in the plated trench; and
   a protective layer encapsulating the mold material, the plated trench, and the filler material.

10. The encapsulation for the module of the electronic device of claim 9, wherein the mold material comprises a Palladium seed layer.

11. The encapsulation for the module of the electronic device of claim 9, wherein the mold material comprises Laser Direct Structuring (LDS)-grade resin.

12. The encapsulation for the module of the electronic device of claim 9, wherein the mold material comprises a metal-plastic additive that is configured to be activated by a laser.

13. The encapsulation for the module of the electronic device of claim 9, wherein the metal plating comprises copper.

14. The encapsulation for the module of the electronic device of claim 9, wherein the metal plating comprises nickel.

15. A module of an electronic device, comprising:
   one or more integrated circuits coupled to a printed circuit board;
   a mold encapsulating the one or more integrated circuits and the printed circuit board, comprising:
      a mold material that activates when a laser is applied, wherein activation causes metal plating to adhere to the mold material when the laser is applied; and
      a trench around a certain portion of the module, comprising the metal plating configured to shield electromagnetic interference (EMI) generated by the certain portion of the module; and
   a protective layer encapsulating the mold material and the trench.

16. The module of the electronic device of claim 15, wherein the protective layer encapsulating the mold material and the trench comprises a metal.

17. The module of the electronic device of claim 15, wherein the certain portion of the module comprises the one or more integrated circuits coupled to the printed circuit board.

18. The module of the electronic device of claim 15, wherein the protective layer encapsulating the mold material and the trench comprises nickel.

19. The module of the electronic device of claim 15, wherein the trench comprises a width of approximately 250 microns.

* * * * *